(12) United States Patent
Gomm

(10) Patent No.: US 10,373,671 B1
(45) Date of Patent: Aug. 6, 2019

(54) TECHNIQUES FOR CLOCK SIGNAL JITTER GENERATION

(71) Applicant: Micron Technology, Inc., Boise, ID (US)

(72) Inventor: Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/948,422

(22) Filed: Apr. 9, 2018

(51) Int. Cl.
| H03H 11/26 | (2006.01) |
| G11C 11/4076 | (2006.01) |
| H03K 5/13 | (2014.01) |
| G06F 7/58 | (2006.01) |
| H03K 5/00 | (2006.01) |
| H03L 7/08 | (2006.01) |
| H03K 23/54 | (2006.01) |

(52) U.S. Cl.
CPC .......... *G11C 11/4076* (2013.01); *G06F 7/588* (2013.01); *H03K 5/13* (2013.01); *H03K 23/54* (2013.01); *H03K 2005/00019* (2013.01); *H03L 7/08* (2013.01)

(58) Field of Classification Search
CPC ................ B41J 2/04541; B41J 2/04563; B41J 2/04505; B41J 2/04573
See application file for complete search history.

(56) References Cited

U.S. PATENT DOCUMENTS

| 5,153,532 A * | 10/1992 | Albers .................. H03K 3/84 331/78 |
| 2005/0062510 A1 | 3/2005 | Zarate et al. |
| 2005/0116751 A1 | 6/2005 | Lin et al. |
| 2007/0103216 A1* | 5/2007 | Han ................. H03K 5/1565 327/175 |
| 2008/0291080 A1 | 11/2008 | Wilens et al. |
| 2009/0108902 A1 | 4/2009 | Chlipala et al. |
| 2010/0085095 A1 | 4/2010 | Kwak |

OTHER PUBLICATIONS

SiTime; "Clock Jitter Definitions and Measurement Methods," Jan. 2014, 15 pages.
C. Stroud; "Linear Feedback Shift Registers (LFSRs);" Department of ECE, Auburn University; Oct. 2004; 7 pages.
Maxim Integrated Products, Inc. "Pseudo-Random Numbver Generation Routine for the MAX765x Microprocessor," Sep. 25, 2002; 5 pages.
International Search Report and Written Opinion for PCT/US2018/061814 dated Mar. 6, 2019, 13 pages.

* cited by examiner

*Primary Examiner* — Sibin Chen
(74) *Attorney, Agent, or Firm* — Fletcher Yoder, P.C.

(57) ABSTRACT

A device may include an integrated circuit and a jitter generator located on the integrated circuit. The jitter generator may include a random number generator to generate a random number in response to a clock input signal. The jitter generator may also include delay-causing circuitry to receive the clock input signals, where the delay-causing circuitry may create a delayed clock input signal. The jitter generator may also include a phase mixer to receive the random number, the delayed clock input signal, and the clock input signal, where the phase mixer additionally outputs a clock output signal having the clock input signal and having jitter.

20 Claims, 10 Drawing Sheets

TECHNIQUES FOR CLOCK SIGNAL JITTER GENERATION

BACKGROUND

The present disclosure relates generally to memory devices and, more particularly, to jitter found on transmitted clocking signals of the memory devices.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system may include an electronic device that, in operation, communicates information via electrical signals. For example, a computing system may include a processor communicatively coupled to a memory device, such as a dynamic random-access memory (DRAM) device implemented on a dual in-line memory module (DIMM). In this manner, the processor may communicate with the memory device, for example, to retrieve executable instructions, retrieve data to be processed by the processor, and/or store data output from the processor.

Over time, these electrical signals may degrade in quality due to, for example, aging of components of the electronic device. Degradation of electrical signals may increase a likelihood of clock jitter afflicting a system, where clock jitter relates to a clocking signal deviating from a desired clocking pattern such that a rising edge of a clocking signal occurs earlier than or later than a desired rising edge time in an unpredictable pattern such that compensating for the jitter is challenging. To facilitate improving operational reliability, performance of a memory device in response to extreme levels of clock jitter may be verified prior to finalization of manufacturing, for example, by an external verification device. In some instances, an external verification device may perform diagnostics on operation of the memory device after a memory device has completed manufacturing, for example, in the event that a customer returns a memory device to a manufacturer or prior to a manufacturer shipping the memory device for sale. In some instances, operation of a memory device may be verified based on analysis of signals indicative of data input to and/or output from the memory device, but not on the basis of how the memory device is responding internally between sub-components of the memory device to the clock jitter. In other words, accuracy of operational monitoring may be affected by performing verification activities by using an external verification device to the memory device and/or computing device. Furthermore, accuracy of operational monitoring may be affected by an external verification device being limited to the stages in a manufacturing process at which verification activities may be performed by the external verification device.

BRIEF DESCRIPTION OF THE DRAWINGS

Various aspects of this disclosure may better be understood upon reading the following detailed description and upon reference to the drawings in which.

DETAILED DESCRIPTION

Figure 1:
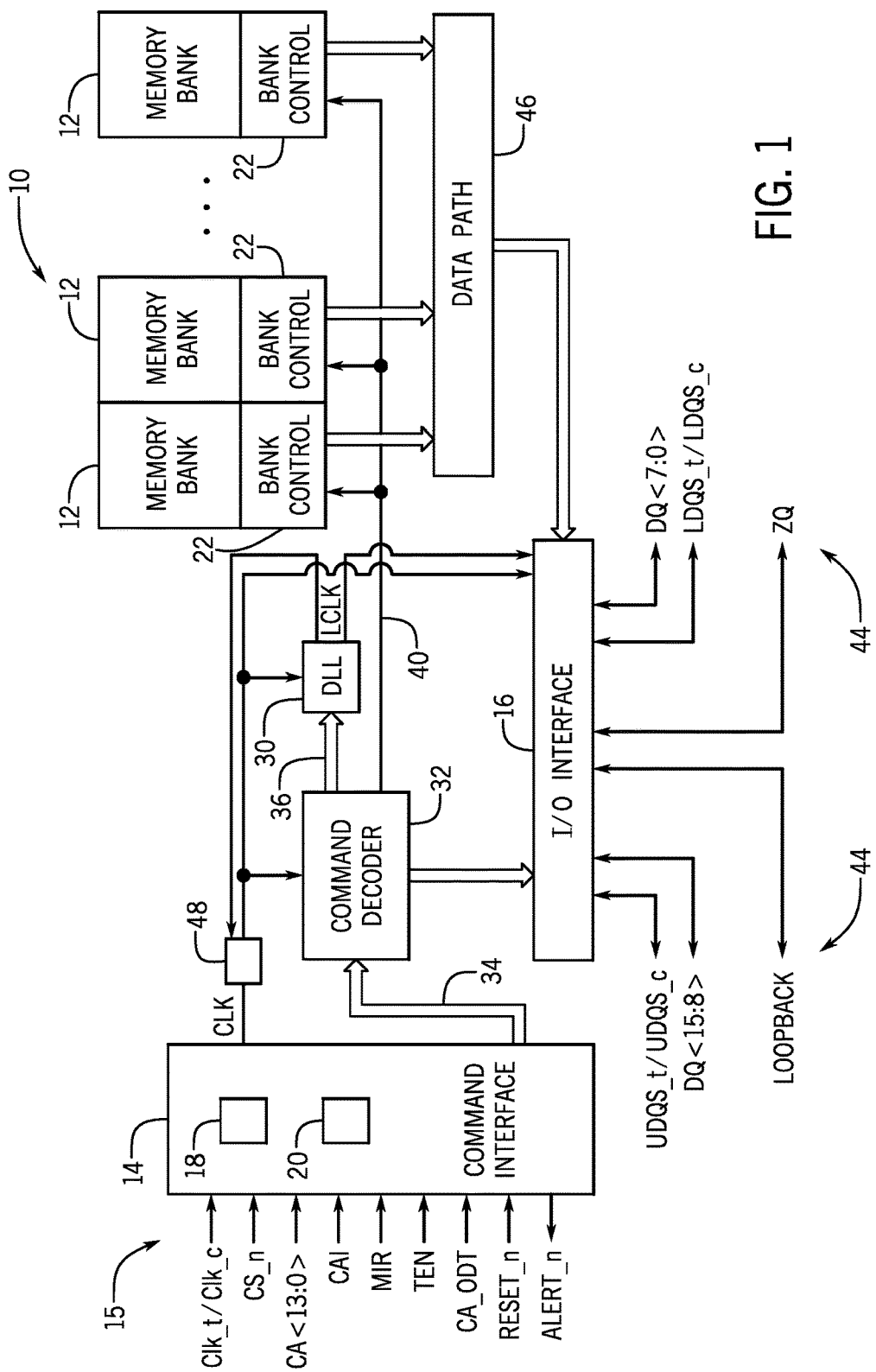
FIG. 1 is a block diagram of a memory device, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor.

Over time, these electrical signals may degrade due to timing differences and component aging. As aging occurs, jitter may be introduced to one or more clocking signals of the computing system. Electronic devices may be sensitive to clock jitter and thus clock jitter may affect performance of the electronic devices in unpredictable ways unless performance of the electronic device is verified to respond a particular way to clock jitter.

Electronic device performance to clock jitter may be verified using an external verification device. The external verification device may generate a clock signal with jitter and may apply the clock signal with jitter to one or more electronic devices of the computing system prior to inclusion in the computing system and/or may apply the jitter to the computing system as a whole. Complications may arise from using the external verification device to verify an electronic device of the computing system while the electronic device is installed in the computing device for example, because the electronic device may be inaccessible to coupling to the external verification device.

To facilitate improving operational reliability of electronic devices, the present disclosure provides techniques for implementing an on-die jitter generator in an electronic device, such as a memory device, to create jitter on a selected clocking signal to enable verification of the electronic device behavior to an amount of clock jitter. Through use of an on-die jitter generator, the memory device may remain internal to the computing device during verification activities and thus performance of the memory device may be evaluated before, during, and after deployment of the memory device in the computing device (e.g., various stages of silicon validation associated with semiconductor integrated circuit development) and/or before, during, and after customer use of a computing device (e.g., debugging a computing device to a manufacturer after customer-purchase and/or customer-use). A jitter generator included on the memory device may receive a selected clocking signal, use the selected clocking signal to generate a random number, use the selected clocking signal to create a delayed clocking signal, and use the random number, the delayed clocking signal, and the selected clocking signal as inputs to a phase mixer to randomly mix the selected clocking signal and the delayed clocking signal together to create an output clocking signal with jitter. It is noted that through techniques described herein, any suitable clocking signal (e.g., clock signal) associated with an electronic device may be used to create a clocking signal with jitter.

In some embodiments, additional capacitors may be included to fill in a distribution of jitter associated with the output clocking signal. Furthermore, in some embodiments, an operational mode selection signal may indicate a variable amount of delay and a variable amount of capacitance to apply to the selected clocking signal to design the jitter applied to the selected clocking signal for a particular verification activity. For example, verifying a first component of the memory device may use a first jitter distribution while verifying a second component of the memory device may use a second jitter distribution. The operational mode selection signal may toggle performance of the jitter generator between creating the first jitter distribution and creating the second jitter distribution.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM may permit reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to permit proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal locked clock signal LCLK based on the received internal clock signal CLK. The phase controlled internal locked clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal locked clock signal LCLK. The phase controlled internal locked clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they may be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To permit higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host device. Further, any host processor may comprise a plurality of processors that share system control. The host processor may be coupled directly or indirectly to additional system elements of the host device, such that the host processor controls the operation of the host device by executing instructions that may be stored within the host device or external to the host device.

As discussed above, data may be written to and read from the memory device 10, for example, by the host device whereby the memory device 10 operates as volatile memory, such as Double Data Rate DRAM (e.g., DDR5 SDRAM). The host device may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host device may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to permit a user to input data into the host device, for example, buttons, switching elements, a keyboard, a light pen, a stylus, a mouse, and/or a voice recognition system, for instance. The host device may optionally also include an output device, such as a display coupled to the processor and a network interface device, such as a Network Interface Card (NIC), for interfacing with a network, such as the Internet.

As will be appreciated, the host device may include many other components, depending on the application of the host device.

The host device may operate to transfer data to the memory device 10 for storage and may read data from the memory device 10 to perform various operations at the host device. Accordingly, to facilitate these data transmissions, in some embodiments, the I/O interface 16 may include a data transceiver that operates to receive and transmit DQ signals to and from the I/O interface 16.

During manufacturing of the memory device 10, an external verification device may operate to perform verification activities to test the memory device 10, for example, prior to installation of the memory device 10 in the host device. The verification activities may confirm that the memory device 10 meets various manufacturing specifications, for example, through testing behavior of internal components of the memory device when exposed to signal jitter. In some embodiments, it may be useful to include a jitter generator 48 inside the memory device 10 to replace and/or supplement usage of the external verification device. By including the jitter generator 48 in the memory device 10, the host device may perform verification activities while the memory device 10 is otherwise inaccessible by the external verification device, such as, at a later stage in a manufacturing process.

Implementing a jitter generator 48 into the memory device 10 may improve validation techniques because the jitter generator 48 enables validation of the memory device 10 at an increased number of stages during and after the manufacturing processes, for example, at a stage where the memory device 10 is accessible via an external verification device and at a stage where the memory device 10 is inaccessible via the external verification device. Through use of a jitter generator 48, the memory device 10 may remain internal to the host device for verification activities and thus performance of the memory device 10 may be evaluated before, during, and after deployment of the memory device 10 in the host device and/or before, during, and after customer use of a host device.

As a method of verifying memory device 10 performance, the jitter generator 48 may operate to create clock jitter on an existing clock signal of the memory device 10, for example, the internal clock signal CLK and/or the phase controlled internal locked clock signal LCLK. As depicted, the jitter generator 48 receives the internal clock signal CLK and the phase controlled internal locked clock signal LCLK. Also as depicted, the jitter generator 48 outputs a clock signal with added jitter to the command decoder 32, the DLL 30, and/or the I/O interface 16. It should be understood that the jitter generator 48 may operate in a variety of operational modes to transmit different jitter signals to different components based on different starting clocks. For example the jitter generator 48 may operate in a first operational mode to transmit the internal clock signal CLK with jitter to the command decoder 32 and may operate in a second operational mode to transmit the phase controlled internal locked clock signal LCLK with jitter to the DLL 30. In some embodiments, the jitter generator 48 may operate in a pass-through mode to enable the internal clock signal CLK and/or the phase controlled internal locked clock signal LCLK to pass-through without having jitter added to the clock signal by the jitter generator 48. In this way, for example, a jitter generator 48 operating in a pass-through mode may receive the internal clock signal CLK and transmit the internal clock signal CLK to the command decoder 32 without jitter being added to the internal clock signal CLK. The command interface 14, and/or a controller or processing circuitry of the host device, may instruct the jitter generator 48 to operate in at least these described operational modes.

Figure 2:
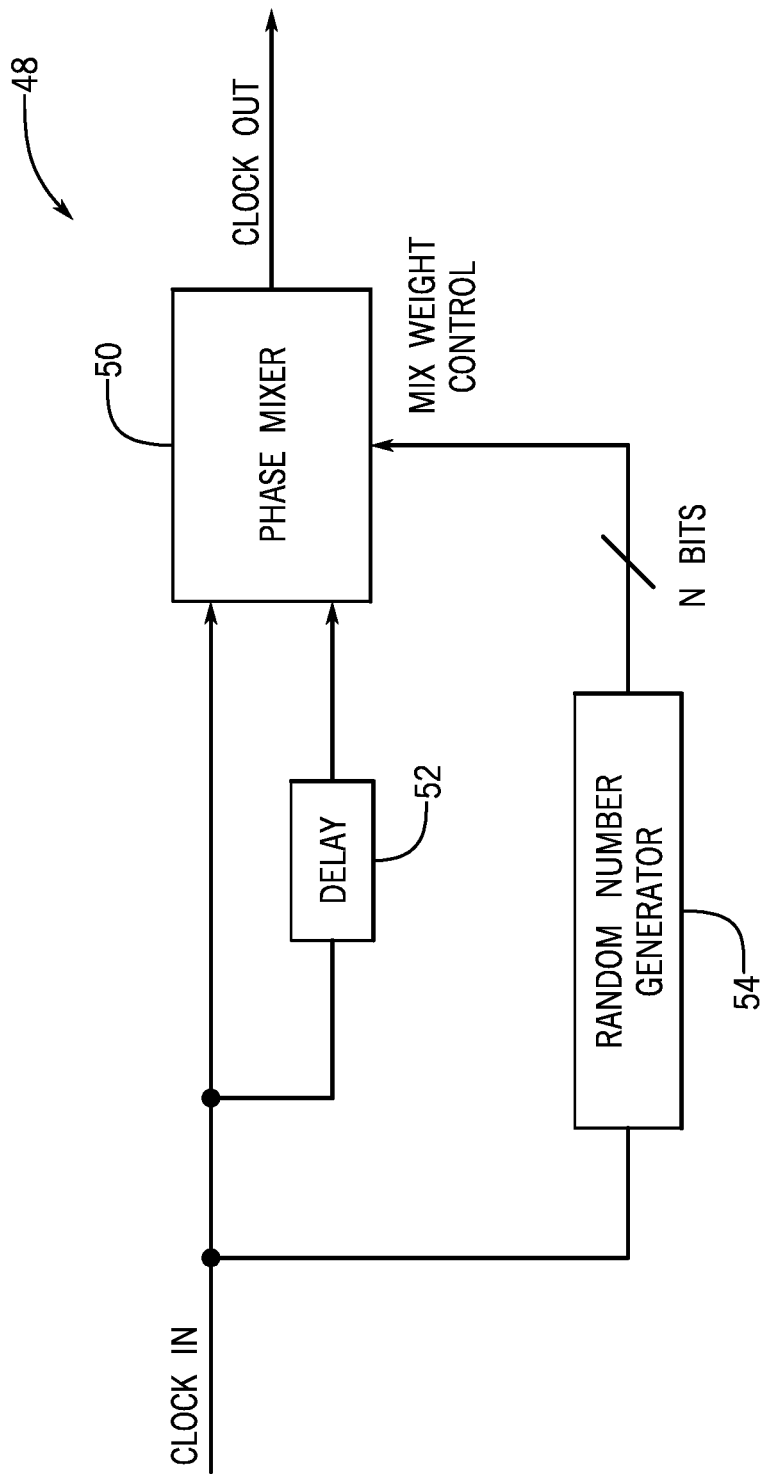
FIG. 2 is a block diagram of a jitter generator of the memory device of FIG. 1, in accordance with an embodiment.

To help illustrate, FIG. 2 depicts an example of a jitter generator 48 that includes a phase mixer 50 receiving a Clock In signal (e.g., clock input signal, any suitable clock signal of an electronic device, an internal clock signal CLK, a phase controlled internal locked clock signal LCLK) and a Mix Weight Control signal of N bits and transmitting a Clock Out signal (e.g., a clock output signal), a delay block 52, and a random number generator 54. It should be appreciated that the depicted jitter generator 48 is merely intended to be illustrative and not limiting. For example, in some embodiments, the jitter generator 48 may receive two clock signals, like an internal clock signal CLK and a phase controlled internal locked clock signal LCLK. It is noted that the Clock Out signal may transmit to a circuit of an electronic device, for example, a command decoder 32, an I/O interface 16, and/or a DLL 30. Additionally or alternatively, it is noted that the delay block 52, as used herein, may be referred to as a delay block or, in some embodiments, a variable delay block, and may also be referred to as delay-causing circuitry. Thus, it should be understood that the delay block 52 and future references to components causing delays may be considered circuitry that cause delay, sequential and/or combinational logic circuitry that cause delay, or delay-causing circuitry.

The jitter generator 48 operates by receiving a signal upon which to add jitter. As is depicted, the received signal is a Clock In signal. The Clock In signal may be any suitable clocking signal of a memory device 10, for example, an internal clock signal CLK and/or a phase controlled internal locked clock signal LCLK. Upon receiving the Clock In signal, the Clock In signal is transmitted to the phase mixer 50, to the delay block 52, and to the random number generator 54.

The delay block 52 delays the Clock In signal such that a rising edge of the delayed Clock In signal occurs at a point later in time than the corresponding rising edge of the Clock In signal. The delay block 52 may be any suitable delay causing circuitry, for instance, combinational logic that acts to delay an input signal based on switching delayed between states of the combinational logic. After delaying the Clock In signal, the delay block 52 transmits the delayed Clock In signal to the phase mixer 50.

The phase mixer 50 randomly mixes two phases of the Clock In signal through using a Mix Weight Control signal of N bits corresponding to a random number generated by the random number generator 54 based in part on the Clock In signal. In some embodiments, each bit of the random number corresponds to a sub-signal of the Mix Weight Control signal of N bits (e.g., the N bits are transmitted in parallel to the phase mixer 50). The phase mixer 50 may implement logic circuitry responsive to the Mix Weight Control signal of N bits to electronically average the Clock In signal and a delayed Clock In signal to create a Clock Out signal inclusive of the Clock In signal with additional jitter.

Figure 3:
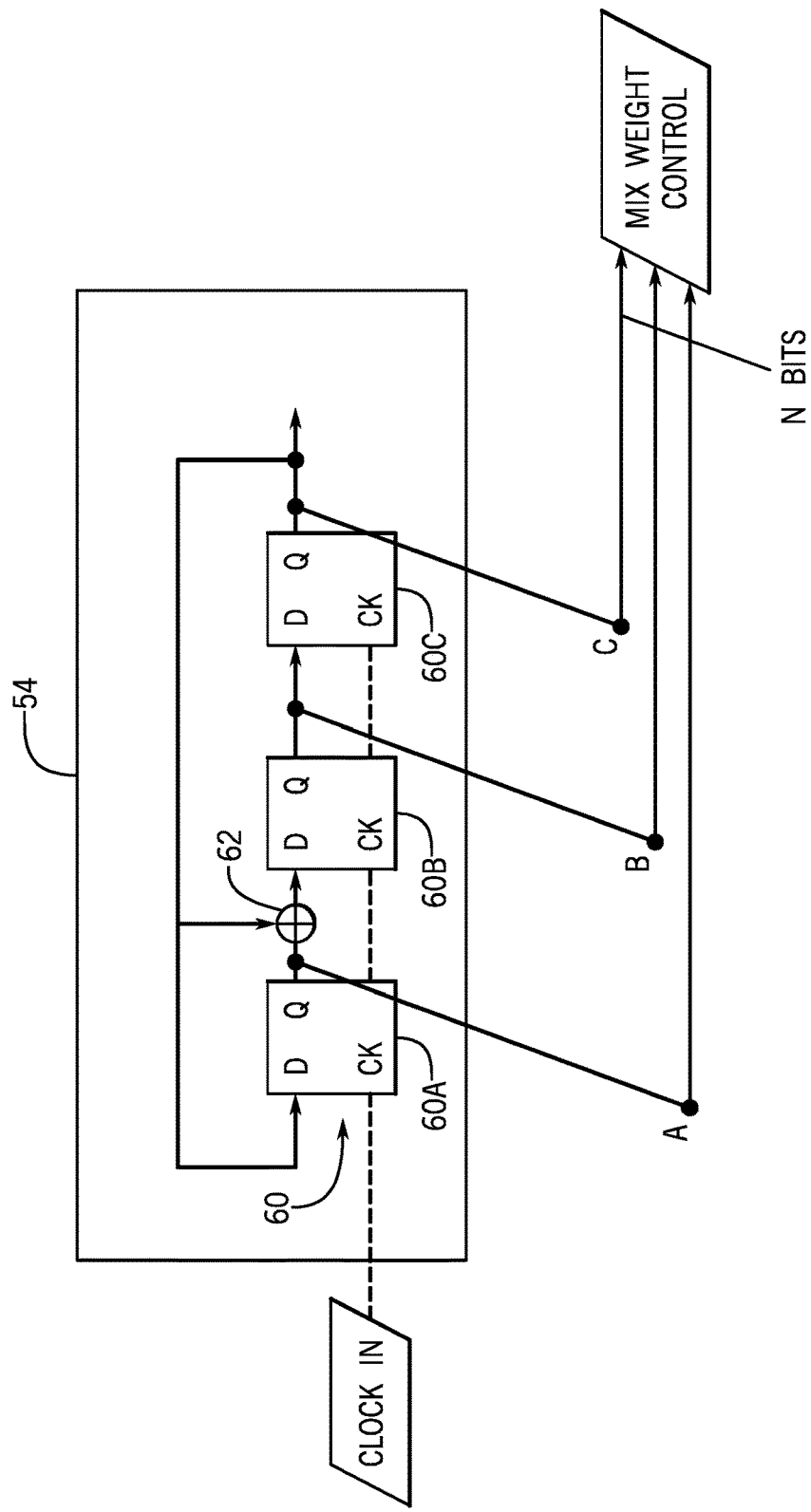
FIG. 3 is a block diagram of a random number generator of the jitter generator of FIG. 2, in accordance with an embodiment.

While it should be understood that the random number generator 54 may be any suitable random number generator that operates to output a random number of N bits, an example of a suitable random number generator 54 may be a linear-feedback shift register including flip-flops 60 and a XOR gate 62, as is shown in FIG. 3. Referring to FIG. 3, for the linear feedback shift register to output a random number of N bits, N number of flip-flops 60 are used on the linear feedback shift register design.

In the depicted linear feedback shift register, a 3 bit number outputs from the random number generator 54 because 3 flip-flops 60 are used. The flip-flops may be initialized to a non-zero state. For example, flip-flops 60A and 60C may be initialized to a logical high, "1," and flip-flop 60B may be initialized to a logical low, "0," corresponding to a non-zero starting number for the pseudo-random counter of 101.

As the Clock In signal clocks the flip-flops 60, the linear feedback shift register changes state, and causes the linear feedback shift register to count in a pseudo-random order, or a non-sequential order, where sequential refers to a traditional counting order (e.g., 1-2-3-4 . . . , 9-8-7-6, and the like). Furthermore, the linear feedback shift register may count in a non-numerically sequential, or pseudo-random, binary counting order, for example, where a binary number for 5 may not follow a binary number for 4 in the sequential counting order. The outputs from flip-flops 60 are represented in Table 1 as following an exemplary pseudo-random binary counting order. For the depicted embodiment, a total of 7 binary states may be generated by the random number generator 54 because the linear feedback shift register outputs non-zero binary states. In general, a total number of binary state outputs of a linear feedback shift register follows a $2^N-1$ relationship to account for not outputting a binary state of all logical lows (e.g., binary representation of zero), where N is a number of flip-flops 60. In this way, in a different embodiment implementing N=9, a linear feedback shift register with nine of the flip-flops 60 may output a total of 511 binary states in a pseudo-random counting order.

TABLE 1

| A | B | C | Mix Weight Control (ABC) |
|---|---|---|---|
| 1 | 0 | 1 | 101 |
| 1 | 0 | 0 | 100 |
| 0 | 1 | 0 | 010 |
| 0 | 0 | 1 | 001 |
| 1 | 1 | 0 | 110 |
| 0 | 1 | 1 | 011 |
| 1 | 1 | 1 | 111 |
| 1 | 0 | 1 | 101 |
| 1 | 0 | 0 | 100 |

For sake of comparison, it is noted that binary counting order usually progresses in a numerically sequential order, for example, 000, 001, 010, 011, 100, 101, 110, and 111. However, since the linear feedback shift register counts in a pseudo-random order, the next number of the counting sequence may not be the same as an expected next number following binary counting in the numerically sequential order.

In the depicted embodiment, and as is shown in Table 1, the Mix Weight Control signal is derived from the bits associated with the counting of the linear feedback shift register. For example, an A output may be a most significant bit associated with a Mix Weight Control signal and a C output may be a least significant bit associated with the Mix Weight Control signal.

Returning to FIG. 2 again, due to the relationship between the random number generator 54 output and the random mixing of the phase mixer 50, signal characteristics of the Clock Out signal may be affected by characteristics of the random number generator 54 output, for example, the signal characteristics of the jitter added to the Clock In signal to create the Clock Out signal. In particular, the signal characteristics of the Clock Out signal are based at least in part on the clock rate of the random number generator 54. In this way, the rate at which the random number generator 54 is clocked at determines the jitter rate of the Clock Out signal. Additionally, optional encoding of the output bits from the random number generator 54 may change a pattern of jitter of the Clock Out signal. Using the output bits directly without encoding as input into the phase mixer 50 may generate a Gaussian distribution of clock jitter, while encoding the output bits with, for example, a thermometer code and/or unary encoding, the phase mixer 50 may generate a uniform distribution of clock jitter on the Clock Out signal. Furthermore, due to a relationship between the delayed Clock In signal and the random mixing of the phase mixer 50, signal characteristics of the Clock Out signal may be affected by characteristics of the delay block 52. In particular, an amount of the delay caused by the delay block 52 may determine a peak-to-peak jitter found in the Clock Out signal.

Figure 4B:
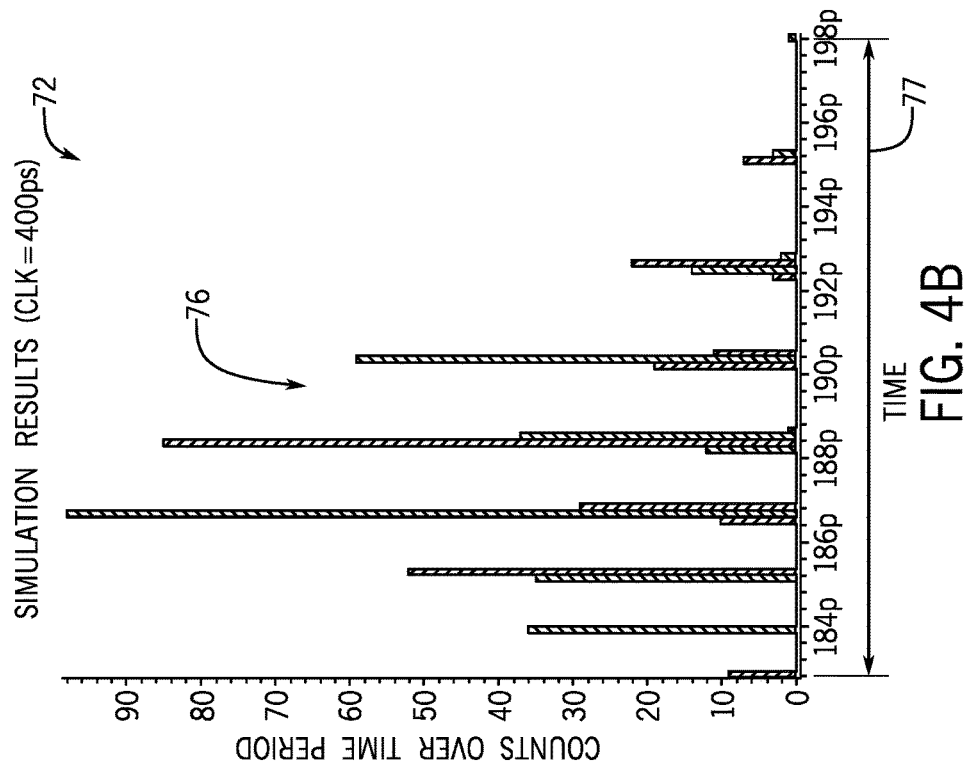
FIG. 4B is a graph of simulated operation of the jitter generator of FIG. 2, in accordance with an embodiment.
Figure 4A:
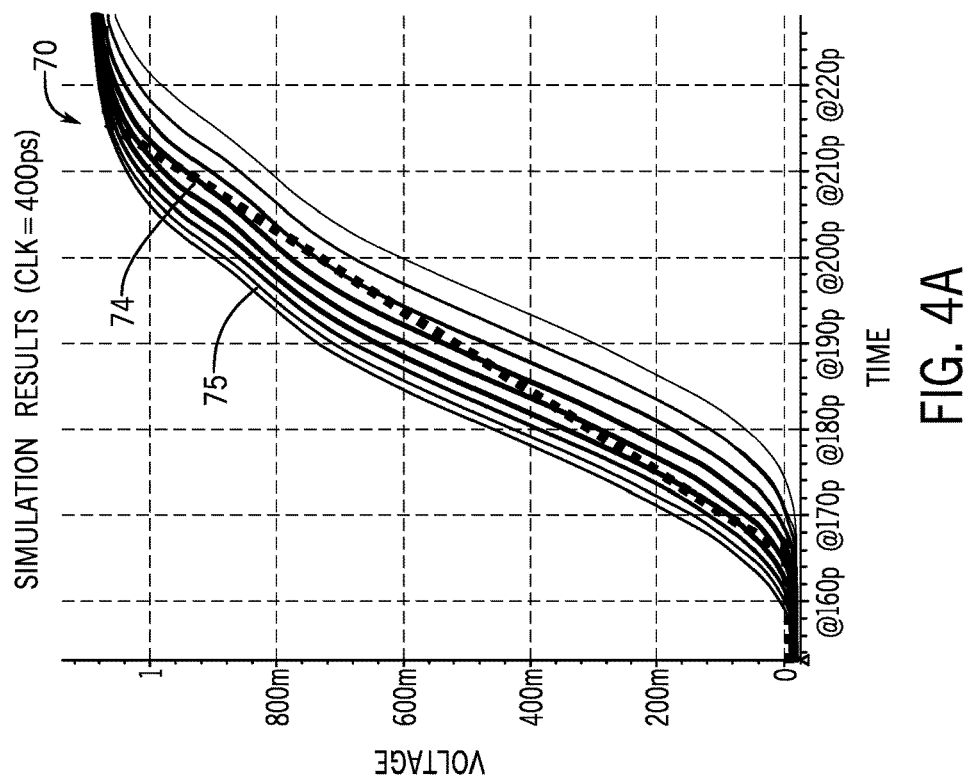
FIG. 4A is a graph of simulated operation of the jitter generator of FIG. 2, in accordance with an embodiment.

Elaborating further on Gaussian distributions of clock jitter and improvements to clock jitter generation, a trace graph 70 is shown in FIG. 4A and a histogram graph 72 is shown in FIG. 4B. Both FIG. 4A and FIG. 4B show signal characteristics over time of a Clock Out voltage signal 75 outputted from a phase mixer 50 receiving a 9-bit random number. It should be understood that while a 9-bit random number is used in this simulation, a random number may have more or less bits based on a specific embodiment of random number generator 54 used in a jitter generator 48. Both the trace graph 70 and the histogram graph 72 were simulated using a Clock In signal having a period of 400 ps. Additionally, the trace graph 70 and the histogram graph 72 both have a measurement window that generally focuses on a first half, the first 200 ps, of the period. Thus, the trace graph 70 shows a rising edge of the Clock In signal with jitter for the first half of the period, and thus, the histogram graph 72 depicts frequency of occurrences 76 of a particular amount jitter as related to counts over the first half of the period, where the more frequent a particular amount of jitter appears in a resultant Clock Out voltage signal 75 for the time period of 200 ps, the higher the count is in the histogram graph 72.

As depicted, the trace graph 70 shows an ideal clock voltage signal 74 and the simulated Clock Out voltage signal 75 (e.g., simulated output from a phase mixer 50) over time where each rising cycle of the Clock Out signal for several cycles of transition of the clocking signal are included and overlaid upon each other on the trace graph 70. In this way, the jitter, or variation of the clocking signal from the ideal clocking signal caused by early and/or delayed transitioning, of the Clock Out signal is shown. The ideal clock voltage signal 74 consistently transitions from a logic low value to a logic high value (e.g., to indicate the clocking). However, the simulated Clock Out voltage signal 75 may transition with varying amounts of time between transitions and thus includes jitter.

The histogram graph 72 highlights frequencies of occurrences 76 of a particular amount jitter over a period of time. The frequencies of occurrences 76 resemble a Gaussian distribution pattern of jitter and are associated with the Clock Out voltage signal 75. The histogram graph 72 shows nine weightings that may occur as output from the phase mixer 50, where the nine weightings are caused by the number of bits of the Mix Weight Control signal. Thus, the histogram graph 72 shows middle weightings to occur more frequently that weightings that cause the most or the least delay. In this simulation, the number of bits of the Mix Weight Control signal were used directly, for example, without encoding, thus the generated Clock Out voltage signal 75 represents an average of the random numbers and follows the Gaussian distribution pattern. If, however, bits associated with the Mix Weight Control signal were encoded, for example, with a thermometer code, the frequencies of occurrences 76 may resemble a uniform distribution pattern where the nine weightings occur with equal frequency. As a final note, the histogram graph 72 shows about a 15 ps separation between the first weighting and the ninth weighting which correlates to a 15 ps peak-to-peak jitter 77 of this Gaussian distribution.

Figure 5B:
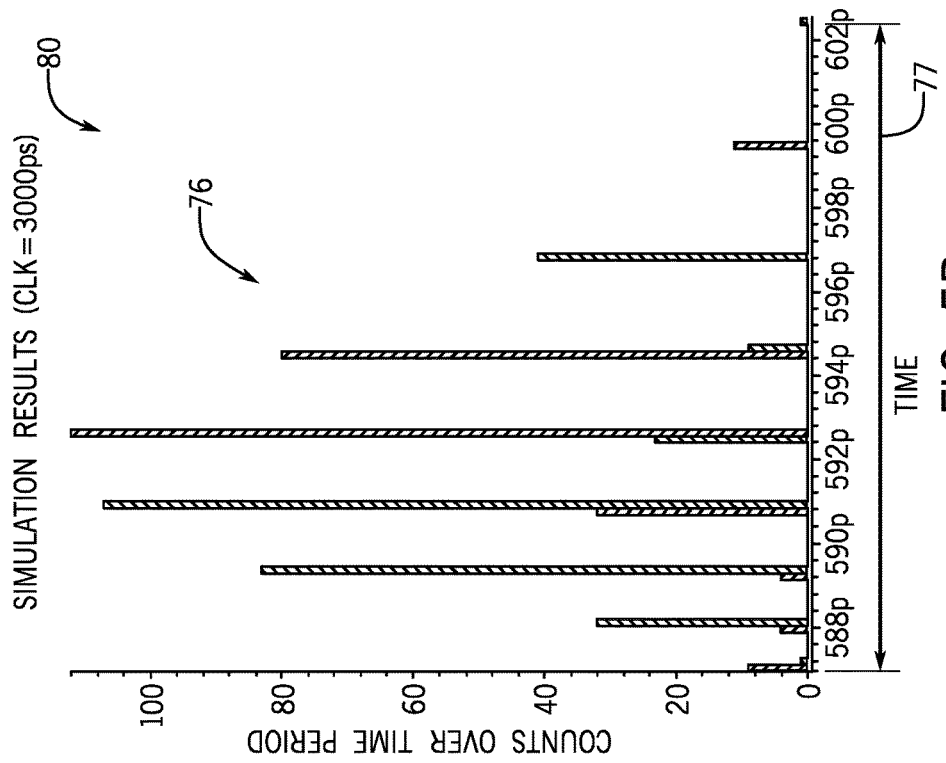
FIG. 5B is a graph of simulated operation of the jitter generator of FIG. 2, in accordance with an embodiment.
Figure 5A:
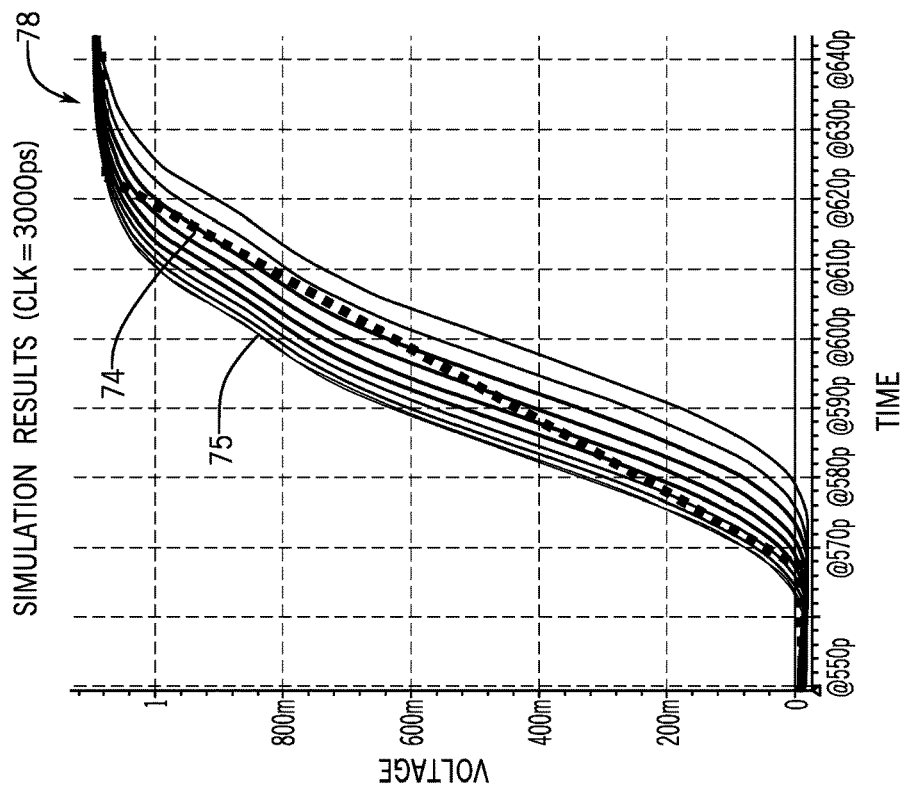
FIG. 5A is a graph of simulated operation of the jitter generator of FIG. 2, in accordance with an embodiment.

Using techniques described with a jitter generator 48 for on-die jitter generation, a peak-to-peak jitter amount may remain constant, even when a period associated with a Clock In signal changes. To illustrate, a trace graph 78 is shown in FIG. 5A and a histogram graph 80 is shown in FIG. 5B. Both FIG. 5A and FIG. 5B show signal characteristics over time of a Clock Out voltage signal 75 outputted from a phase mixer 50 receiving a 9-bit random number. Both the trace graph 78 and the histogram graph 80 were simulated using a Clock In signal having a period of 3000 ps. Similar to FIG. 4A and FIG. 4B, the trace graph 78 shows a rising edge of the Clock Out voltage signal 75 with jitter for the first half of the period and the histogram graph 80 depicts frequencies of occurrences 76 of a particular amount jitter as related to counts over the first half of the period, where the more frequent a particular amount of jitter appears in a resultant Clock Out voltage signal 75, the higher the count is in the histogram graph 80.

Comparing FIG. 5A to FIG. 4A and FIG. 5B to FIG. 4B, the Clock Out voltage signal 75 in both the trace graph 78 and the trace graph 70, as well as the frequencies of occurrences 76 in the histogram graph 72 and in the histogram graph 80, look similar. In addition, the histogram graph 80 shows peak-to-peak jitter 77 amount to be independent of a period associated with a Clock Input voltage signal because the histogram graph 80 shows a 15 ps separation between the first weighting and the ninth weighting correlating to a 15 ps peak-to-peak jitter 77 of this Gaussian distribution, which is the same peak-to-peak jitter 77 as the histogram graph 72. This similarity demonstrates that implementing the jitter generator 48 creates jitter on a Clock In signal that has the same peak-to-peak jitter 77 despite changing a period associated with the Clock In signal.

Figure 6:
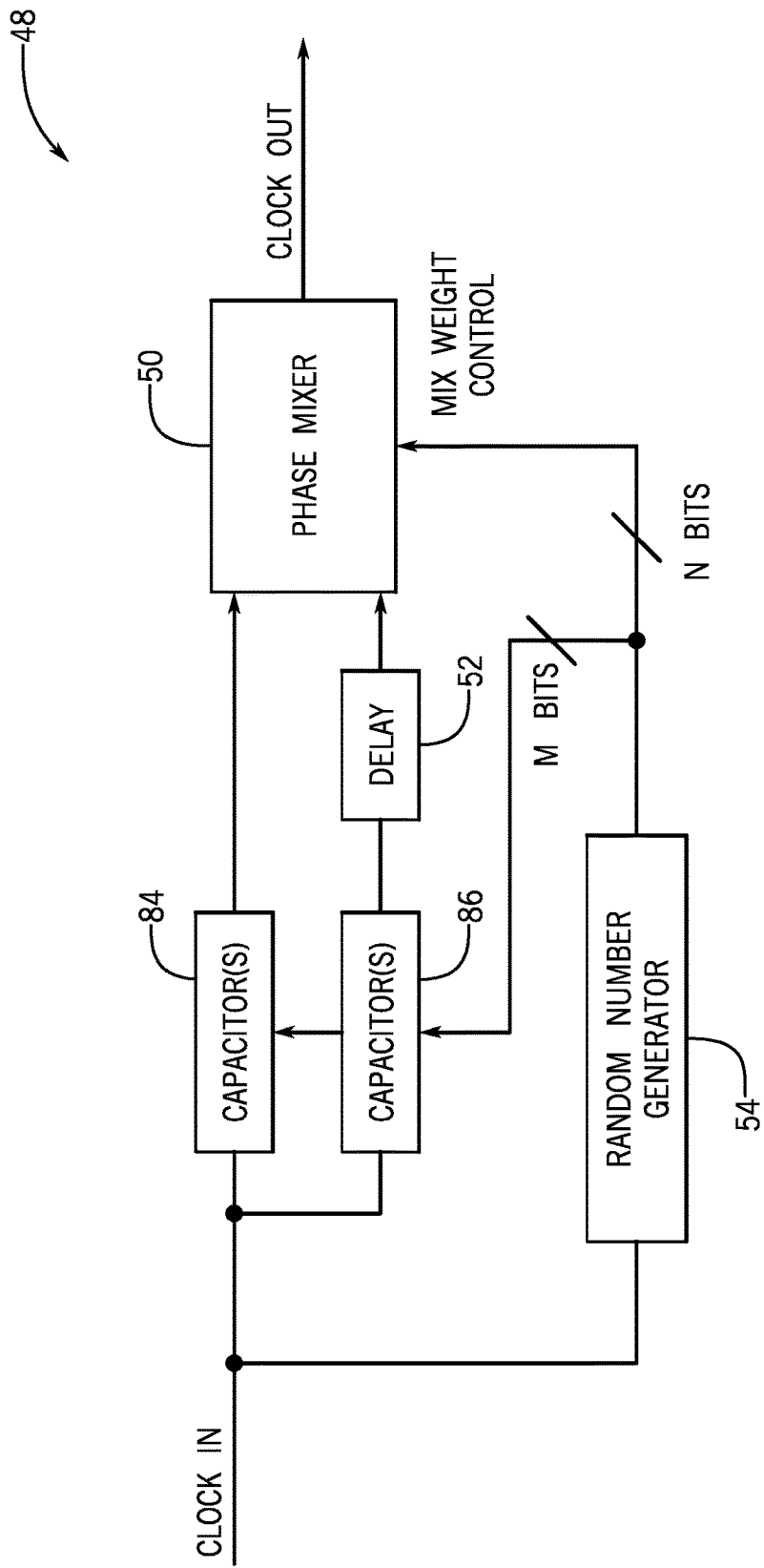
FIG. 6 is a block diagram of the jitter generator of FIG. 2, in accordance with an embodiment.

In some embodiments of a jitter generator 48, the Clock Out signal may be designed to fill in distribution gaps between frequencies of occurrences 76, as seen in the histogram graph 72 and the histogram graph 80. To help illustrate, FIG. 6 depicts an example of an embodiment of a jitter generator 48 that includes a phase mixer 50 receiving a Clock In signal (e.g., a clock input signal, any suitable clock signal of an electronic device, an internal clock signal CLK, a phase controlled internal locked clock signal LCLK) and a Mix Weight Control signal of N bits and transmitting a Clock Out signal (e.g., a clock output signal), a delay block 52, a random number generator 54, one or more capacitors 84 having a variable capacitance, and one or more capacitors 86 having a variable capacitance. It should be appreciated that the depicted jitter generator 48 is merely intended to be illustrative and not limiting. It is noted that the Clock Out signal may transmit to a circuit of an electronic device, for example, a command decoder 32, an I/O interface 16, and/or a DLL 30.

The jitter generator 48 operates by receiving a signal upon which to add jitter. As is depicted, the received signal is a Clock In signal. Upon the jitter generator 48 receiving the Clock In signal, the Clock In signal transmits through the one or more capacitors 84 to the phase mixer 50, through the one or more capacitors 86 to the delay block 52, and to the random number generator 54. The random number generator 54 operates to output a random number of N bits, where M bits, as a subset of the N bits, transmit as a control signal to the one or more capacitors 84 and the one or more capacitors 86. It is noted that the M bits may be selected from the N bits in any suitable way, including but not limited to, an electrical coupling between the random number generator 54, the one or more capacitors 84, and the one or more capacitors 86 designed to transmit the same sub-set of N bits for each random number as the M bits. For example, if N bits equals 11011000 and the sub-set of N bits corresponding to M bits refers to the four least significant bits, the electrical coupling may transmit 1000 as the M bits, however if the N bits equal 10101010, the electrical coupling may transmit 1010 as the M bits. The one or more capacitors 84 and the one or more capacitors 86 may be electrically coupled and/or electrically decoupled in response to the pseudo-random M bits, for example, through switches changing state in response to the M bits control signal. This electrical coupling and/or decoupling serves to respectively change an overall capacitance value of the one or more capacitors 84 and of the one or more capacitors 86. The variable capacitance value of the one or more capacitors 84 and the one or more capacitors 86 may further modulate phases of the Clock In signal prior to transmission of the Clock In signal to the phase mixer 50 and/or the delay block 52. Thus, through selecting one or more values for the one or more capacitors 84 and the one or more capacitors 86, and selecting a delay value to be applied through the delay block 52, a jitter distribution may be designed.

Figure 7B:
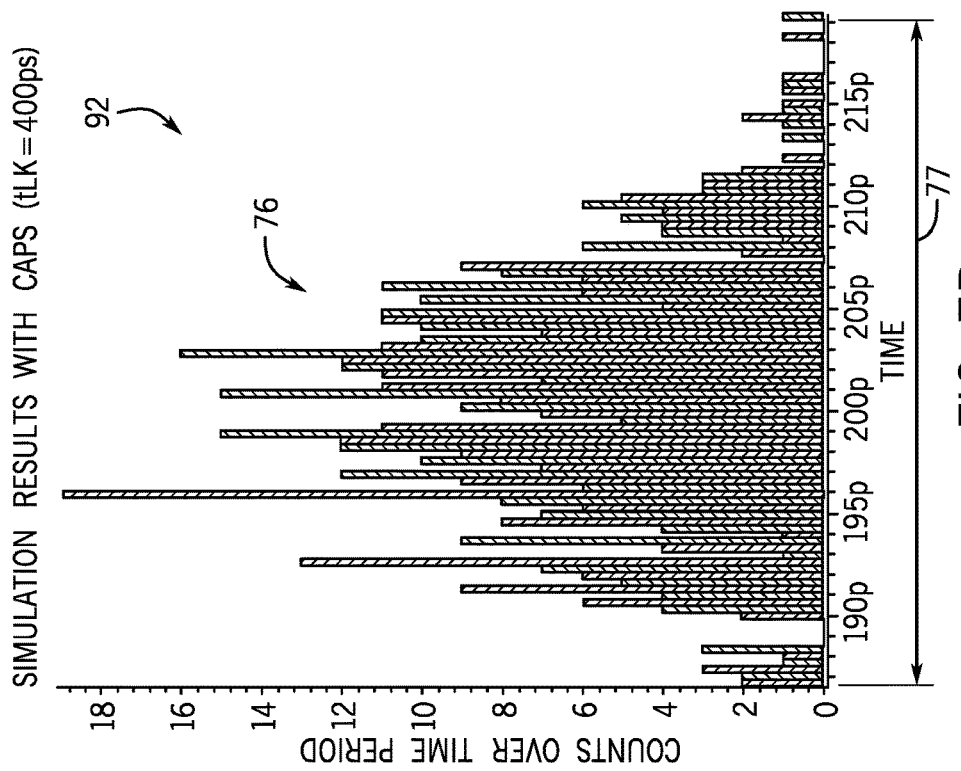
FIG. 7B is a graph of simulated operation of the jitter generator of FIG. 6, in accordance with an embodiment.
Figure 7A:
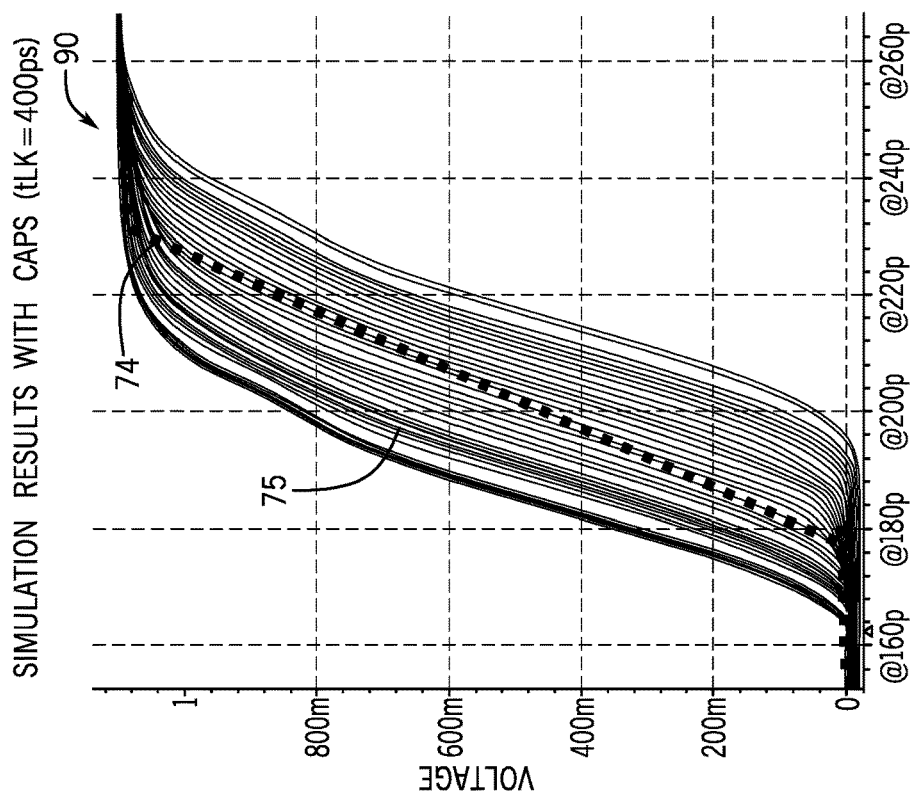
FIG. 7A is a graph of simulated operation of the jitter generator of FIG. 6, in accordance with an embodiment.

Elaborating further on filling in distribution gaps of clock jitter, a trace graph 90 is shown in FIG. 7A and a histogram graph 92 is shown in FIG. 7B. Both FIG. 7A and FIG. 7B show signal characteristics over time of a Clock Out voltage signal 75 outputted from a jitter generator 48 implementing variable capacitors (e.g., one or more capacitors 84 and one or more capacitors 86). Both the trace graph 90 and the histogram graph 82 were simulated using a Clock In signal having a period of 400 ps. Similar to FIG. 4A, FIG. 4B, FIG. 5A, and FIG. 5B, the trace graph 90 shows a rising edge of the Clock Out voltage signal 75 with jitter for the first half of the period and the histogram graph 92 depicts frequencies of occurrences 76 of a particular amount of jitter as related to counts over the first half of the period, where the more frequent a particular amount of jitter appears in a resultant Clock Out voltage signal 75, the higher the count is in the histogram graph 92.

Comparing FIG. 7A to FIG. 4A and FIG. 7B to FIG. 4B, FIG. 7B shows gaps between the frequencies of occurrences 76, for example, in the histogram 72 of FIG. 4B, filled in due to the addition of the variable capacitors in the jitter generator 48. In addition, the inclusion of the variable capacitors in the jitter generator 48 also affected the peak-to-peak jitter 77. As shown in the histogram graph 92, the peak-to-peak jitter 77 is now about 30 ps, increased from 15 ps. While the addition of the variable capacitors affects both phases of the Clock In signal transmitted to a phase mixer 50 causing the increase in peak-to-peak jitter 77, the addition of the variable capacitors also serves to improve a centering of the Gaussian distribution of the frequencies of occurrences 76.

Figures 8A, 8B:
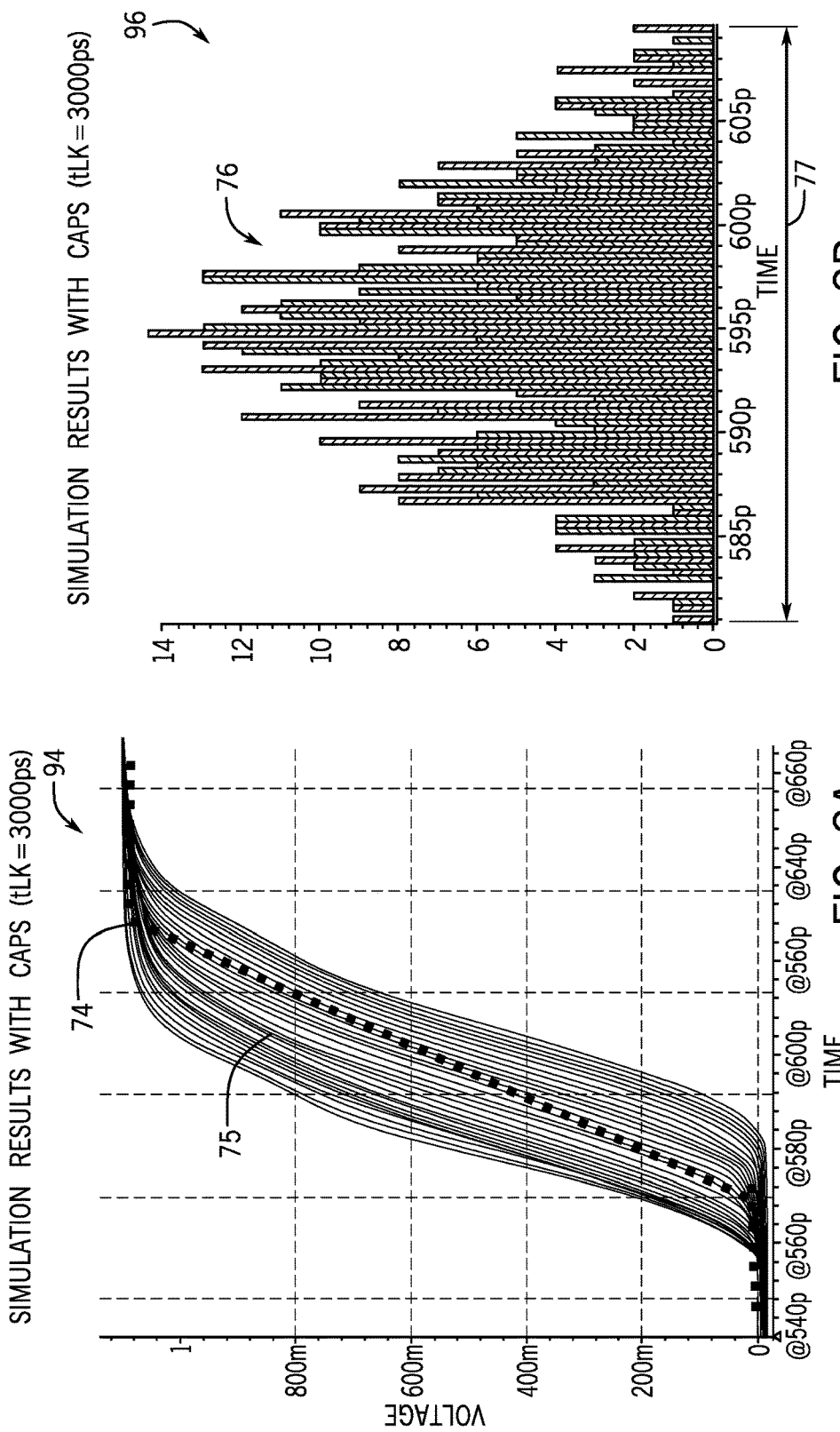
FIG. 8A is a graph of simulated operation of the jitter generator of FIG. 6, in accordance with an embodiment.
FIG. 8B is a graph of simulated operation of the jitter generator of FIG. 6, in accordance with an embodiment.

To additionally emphasize how increasing a Clock In signal period does not alter the peak-to-peak jitter, a trace graph 94 is shown in FIG. 8A and a histogram graph 96 is shown in FIG. 8B. Both FIG. 8A and FIG. 8B show signal characteristics over time of a Clock Out voltage signal 75 outputted from a jitter generator 48 implementing variable capacitors (e.g., one or more capacitors 84 and one or more capacitors 86). Both the trace graph 94 and the histogram graph 96 were simulated using a Clock In signal having a period of 3000 ps. Similar to FIG. 4A, FIG. 4B, FIG. 5A, FIG. 5B, FIG. 7A, and FIG. 7B, the trace graph 94 shows a rising edge of the Clock Out voltage signal 75 with jitter for the first half of the period and the histogram graph 96 depicts frequencies of occurrences 76 of a particular amount jitter as related to counts over the first half of the period, where the more frequent a particular amount of jitter appears in a resultant Clock Out voltage signal 75, the higher the count is in the histogram graph 96.

Comparing FIG. 8B to FIG. 7B and FIG. 5B, FIG. 8B shows distribution gaps of frequencies of occurrences 76, for example, in histogram graph 80 of FIG. 5B, filled in due to the addition of the variable capacitors in the jitter generator 48. In addition, the inclusion of the variable capacitors in the jitter generator 48 also affected the peak-to-peak jitter 77. As shown in the histogram graph 96, the peak-to-peak jitter 77 of FIG. 8A is now about 30 ps, increased from the peak-to-peak jitter 77 of 15 ps of FIG. 5B. However, the peak-to-peak jitter 77 of about 30 ps is the same as the peak-to-peak jitter 77 of FIG. 7B, thus showing that changing a Clock In signal period does not measurably affect the peak-to-peak jitter 77. While the addition of the variable capacitors affects both phases of the Clock In signal transmitted to a phase mixer 50 causing the increase in peak-to-peak jitter 77, the addition of the variable capacitors also serves to improve a centering of the Gaussian distribution of the frequencies of occurrences 76.

In some embodiments of a jitter generator 48, it may be desirable to have a variable delay, that is, a delay block 52 that is capable of causing a delay of a first value for a first validation activity and is capable of causing a delay of a second value for a second validation activity. A variable delay block may operate to change the value of delays in response to a mode selection control signal (e.g., an operational mode selection control signal). In other words, the variable delay block includes variable delay circuitry that varies a delay caused based on an operational mode indicated by the mode selection control signal. Furthermore, in some embodiments, as the delay changes through operational mode changes, one or more corresponding control signals may also transmit to one or more capacitors 84 and/or one or more capacitors 86 to adjust a capacitance value based on the delay applied, where the one or more capacitors 84 and/or one or more capacitors 86 are used to fill in the distribution of the jitter applied to a Clock In signal.

Figure 9:
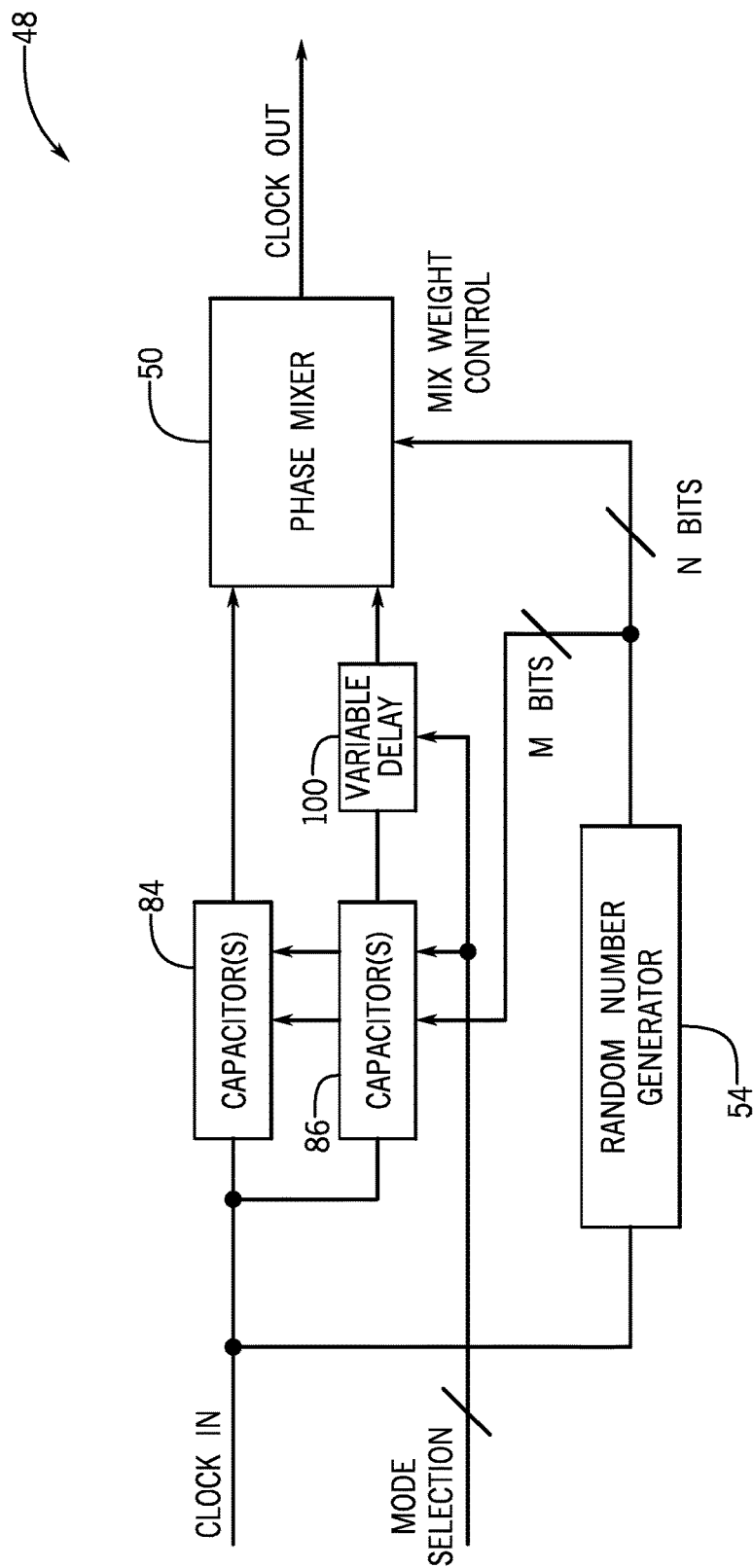
FIG. 9 is a block diagram of another embodiment of the jitter generator of FIG. 2, in accordance with an additional embodiment.

To help illustrate, FIG. 9 an example of a second embodiment of a jitter generator 48 that includes a phase mixer 50 receiving a Clock In signal (e.g., any suitable clock signal of an electronic device, an internal clock signal CLK, a phase controlled internal locked clock signal LCLK) and a Mix Weight Control signal of N bits and transmitting a Clock Out signal (e.g., a clock output signal), a delay block 52, a random number generator 54, one or more capacitors 84 having a variable capacitance, one or more capacitors 86 having a variable capacitance, and a variable delay block 100. It should be appreciated that the depicted jitter generator 48 is merely intended to be illustrative and not limiting. It is noted that the Clock Out signal may transmit to a circuit of an electronic device, for example, a command decoder 32, an I/O interface 16, and/or a DLL 30.

The jitter generator 48 operates by receiving a signal upon which to add jitter and receiving two or more signals indicative of an operational mode for the variable delay block 100, where different operational modes may cause different amounts of delay to the delayed Clock In signal. As is depicted, the received signals are a Clock In signal and a Mode Selection signal. The Clock In signal may be any suitable clocking signal of a memory device 10, or host device, to which it is desired to add jitter. The Mode Selection signal is a control signal transmitted from a host device to the jitter generator 48 for the purpose of changing signal characteristics, for example, a peak-to-peak jitter, a delay associated with the jitter, and the like, of the Clock Out signal transmitted from the jitter generator 48. In some embodiments, additional control signals may be transmitted by a host device to the jitter generator 48 to change a transmission destination of the Clock Out signal, for example, to transmit to a command decoder 32, a I/O interface 16, and/or a DLL 30.

Upon receiving the Clock In signal, the Clock In signal is transmitted through the one or more capacitors 84 to the phase mixer 50, through the one or more capacitors 86 to the variable delay block 100, and to the random number generator 54. The random number generator 54 operates to output a random number of N bits, where M bits, as a subset of the N bits, are transmitted as a control signal to the one or more capacitors 84 and the one or more capacitors 86. Furthermore, a Mode Selection signal is transmitted as a control signal to the one or more capacitors 84 and the one or more capacitors 86. As described for FIG. 6, the one or more capacitors 84 and the one or more capacitors 86 may be electrically coupled and/or electrically decoupled in response to control signals, for example, through switches changing state in response to the M bits control signal and/or in response to the Mode Selection signal. For instance, the control signals may activate a first capacitor of the one or more capacitors 84 but not a second capacitor of the one or more capacitors to cause a variable change in capacitors. This electrical coupling and/or decoupling serves to respectively change an overall capacitance value of the one or more capacitors 84 and/or of the one or more capacitors 86. In this way, in the depicted embodiment of FIG. 9, the one or more capacitors 84 and the one or more capacitors 86 may be variable capacitors whose value changes in response to the control signal.

In addition, the Mode Selection signal may enable or disable the one or more capacitors 84 and/or the one or more capacitors 86 such that the M bits control signal is unable to electrically couple and/or electrically decouple the one or more capacitors 84 and/or the one or more capacitors 86. This ability to control if a capacitor affects the Clock In signals transmitted to the phase mixer 50 may translate into the Mode Selection signal enabling and/or disabling the one or more capacitors 84 and/or the one or more capacitors 86 in response to an operational mode for the variable delay block 100. For example, in response to an increase in delay caused by the variable delay block 100, the Mode Selection signal may be used to enable additional capacitors of the one or more capacitors 84 and the one or more capacitors 86 to improve gaps in the Clock Out signal jitter distribution.

Figure 10:
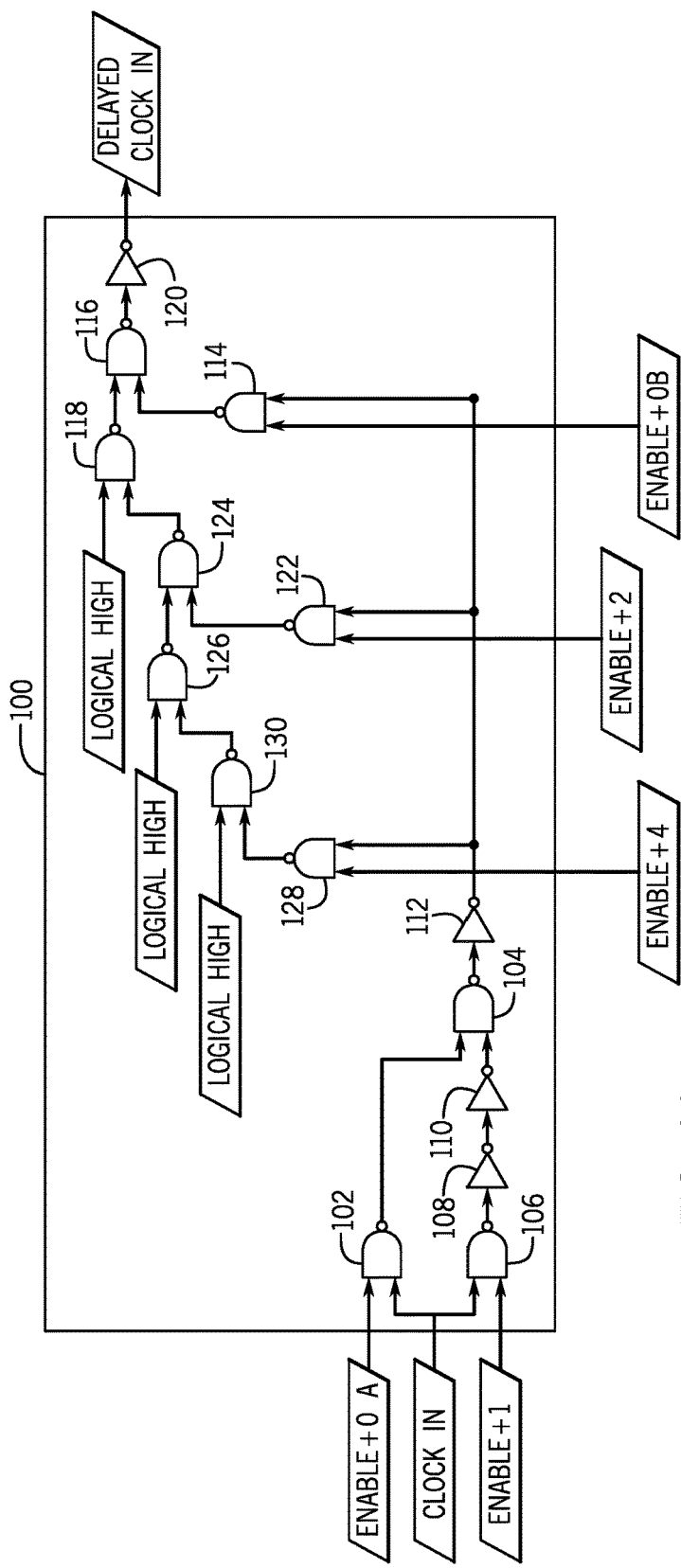
FIG. 10 is a block diagram of a variable delay block of the jitter generator of FIG. 9, in accordance with an embodiment.

To better explain the relationship between the Mode Selection signal and the delayed Clock In signal, FIG. 10 depicts an example embodiment of a variable delay block 100 having one or more logic gates, as represented by NAND logic gates 102, 104, 106, 114, 116, 118, 122, 124, 128, and 130 and inverting logic gates 108, 110, 112, and 120. It should be appreciated that the depicted variable delay block 100 is merely intended to be illustrative and not limiting. For example, a variable delay block 100 may include a variety of circuitry or processing components capable of providing a variable delay to a Clock In signal, including any suitable combination of AND logic gates, NAND logic gates, OR logic gates, NOR logic gates, XOR logic gates, NOT logic gates (e.g., inverter and/or inverting logic gates), and the like. Furthermore the Mode Selection signal may include one or more enable signals to control the variable delay block 100 and the variable capacitors (e.g., the one or more capacitors 84 and/or the one or more capacitors 86). As depicted, the Mode Selection signal may provide one or more of an Enable +0 A signal, an Enable +1 signal, an Enable +0 B signal, an Enable +2 signal, and/or an Enable +4 signal. It should be understood that in other embodiments, more or less enable signals may be transmitted with the Mode Selection signal based on specific combinational logic and/or circuitry used in the embodiment.

The variable delay block 100 operates by receiving a Clock In signal and the Mode Selection signal of one or more communicative couplings, represented by Enable +0 A, Enable +1, Enable +0 B, Enable +2, Enable +4, each corresponding to a different amount of delay to apply to the Clock In signal. In this way, based on which enable signal is transmitted to the variable delay block 100, logic gates provide varying amounts of delay to the Clock In signal to create a delayed Clock In signal. As depicted, the variable delay block 100 may electrically couple some logic gates to a voltage equivalent to a logical high for the embodiment to cause a logical high value to transmit to a terminal of a logic gate. For example, NAND logic gates 118, 126, and 130 are electrically coupled to the equivalent to a logical high and thus receive a logical high value to its terminal. It should be understood that in some embodiments, a logical low value may be transmitted to a terminal of a logic gate through an electrical coupling to a voltage equivalent to a logical low for the embodiment. Thus, through combinations of logic gates and held logical inputs (e.g., consistent logical high value), a Clock In signal may be delayed.

Working through the combinational logic presented in FIG. 10, the variable delay block 100 receives the Clock In signal and one or more enable signals. The Clock In signal receives transitions periodically from low to high and the enable signal may be a consistent enable signal corresponding to a logical high signal. For the purposes of explanation, the combination logic behavior is explained in terms of "1" and "0," where "1" corresponds to a logical high signal and/or voltage transmitted to a logic gate and "0" corresponds to a logical low signal and/or voltage transmitted to a logic gate. The enable signals are provided to the variable delay block 100 based on an operational mode that the variable delay block 100 is being instructed to operate in through the Mode Selection signal. An example of the operational modes that the variable delay block 100 may operate in, and the corresponding enable signals, is shown in Table 2. The operational modes are listed in an order from a least delay provided to a most delay provided such that a first operational mode corresponds to a smallest value of delay added to the Clock In signal and a sixth operational mode corresponds to a largest value of delay added to the Clock in signal. Although not included in Table 2, it should be understood that the operational modes may correspond to one or more enable signals to enable and/or disable respective capacitors of the one or more capacitors 84 and/or the one or more capacitors 86 to, for example, continue to fill in jitter distributions of the Clock Out signal as a peak-to-peak jitter changes from changing the delay applied to the Clock In signal. It should be understood that these relative lengths of delay are based on the combinational logic of the depicted embodiment and more or less operational mode may be used with different embodiments to provide differing amounts of delay.

TABLE 2

| Operational Mode | Mode Selection Signal (X indicates the enable signals transmitted as a logical high) | | | | |
|---|---|---|---|---|---|
| | Enable +0 A | Enable +1 | Enable +0 B | Enable +2 | Enable +4 |
| First | X | | X | | |
| Second | | X | X | | |
| Third | X | | | X | |
| Fourth | | X | | X | |
| Fifth | X | | | | X |
| Sixth | | X | | | X |

Looking first at a first operational mode corresponding to the Enable +0 A signal and the Enable +0 B signal, if the Clock In signal is 0 and the Enable +0 A signal is 1, then the output from the NAND logic gate 102 is 1, and the 1 output is transmitted to a terminal of NAND logic gate 104. In a first operational mode, the Enable +0 A signal is 1 and the other enable signals are 0. So, while in the first operational mode, when the Clock In signal is 0 and the Enable +1 signal is 0, the NAND logic gate 106 outputs a 1 which is transmitted to the inverting logic gate 108 to become a 0. The 0 output from the inverting logic gate 108 is transmitted to the inverting logic gate 110 to become a 1. The 1 is transmitted from the inverting logic gate 110 to the NAND logic gate 104. Thus, the NAND logic gate 104 receives a 1 input from the inverting logic gate 110 and a 1 input from the NAND logic gate 102. These inputs cause the NAND logic gate 104 to output a 0. The 0 output is transmitted from the NAND logic gate 104 to the inverting logic gate 112 and becomes a 1. The 1 output is transmitted from the inverting logic gate 112 to the NAND logic gates 128, 122, and 114. For the first operational mode, the NAND logic gate 114 is enabled from the Enable +0 B signal transmitting a 1. The NAND logic gate 114 receives the 1 output from the inverting logic gate 112 and receives the 1 input from the Enable +0 B signal. In response to the 1 input, the NAND logic gate 114 transmits a 0 to the NAND logic gate 116. While in the first operational mode, the NAND logic gate 116 receives a 1 output transmitted from the NAND logic gate 118, based on the Enable +4 signal and the Enable +2 signal both being 0 and based on the output from inverting logic gate 112 transmitting to each NAND logic gate 128 and 122. Thus, the NAND logic gate 116 in response to receiving a 0 and a 1 outputs a 1 to the inverting logic gate 120. The inverting logic gate 120 receives the 1 and outputs a 0, which is transmitted as part of a delayed Clock In signal. In this way, the Delay Clock In signal indicates a 1 or a 0 based on the Clock In signal affected the ultimate output from inverting logic gate 112 and with a delay from transmitting through the combinational logic.

It should be understood that the other operational modes operate similarly to the first operational mode, where each of the enable signals are transmitted as logical high to the variable delay block 100 corresponds to Table 2. For brevity's sake, explanation of the combinational logic response to each of the six operational mode is skipped and it should be understood that the NAND logic gates 102, 104, 106, 114, 116, 118, 122, 124, 128, and 130 and the inverting logic gates 108, 110, 112, and 120 follow conventional inverting and NAND logic gate logic. In this way, an inverting logic gate inverts the input to create the output (e.g., a 0 input outputs as a 1, a 1 input outputs as a 0) and a NAND logic gate outputs a logical high for input combinations except for two logical high inputs which generates a logical low output (e.g., a 1 input and a 1 input cause a 0 output, a 1 input and a 0 input cause a 1 output, and a 0 input and a 0 input cause a 1 output). Following these guidelines, combinational logic presented in the depicted embodiment of the variable delay block 100 may be traced.

In addition, in some embodiments, the enable signal inputs may be electrically coupled to one or more fuses such that a particular operational mode may be permanently fixed and/or excluded from future use. In this way, an operator of testing equipment may use the host device to perform verification activities on a memory device 10 having a jitter generator 48 on-die and upon completion of the verification activities, the host device may respond by disabling the electrical coupling, for example, by destroying the fuse. Through burning of the fused electrical connection, the host device may be unable to electrically couple to one or more inputs of the jitter generator to provide one or more enable signals. As described, a host device may operate, or be operated, to permanently prevent access to changing the enable signals, to providing enable signals, and/or to providing jitter to the on-die clock as to not permit inadvertent verification during a normal operation of the memory device 10.

Using techniques of on-die jitter generation may enable several other applications. For example, in some instances, a dither circuit is used in data converting circuits. 1-bit analog-to-digital converters may benefit from adding jitter to an input signal to facilitate with the conversion. Furthermore, noise-shaping digital-to-analog conversion circuits may benefit from using added jitter to an input signal to help with filtering of unwanted signal harmonics in a spectrum of an output signal. Moreover, circuits which have an inherent hysteresis in time may benefit from adding jitter greater than the value of the inherent hysteresis. For example, a delay locked loop and/or a phase locked loop may have hysteresis to determine a state of equal phase. The addition of jitter greater than the hysteresis during a static trim procedure may improve a centering of a final trimmed state of a recovered signal. These benefits are afforded to the jitter generating circuit because this jitter generator disclosed herein may add amounts of jitter to a signal without changing a frequency or content of the signal, making the jitter generating circuit of particular use in digital signal application.

Accordingly, the technical effects of the present disclosure include techniques for creating jitter on a clocking signal for the purpose of performing verification activities on a memory device. The techniques include systems and methods for creating a random number to be used to randomly mix an input clock signal and a delayed input clock signal. These systems and methods cause an on-die jitter generator to generate jitter on the input clock signal as an output clock signal to verify performance of a memory. Through varying capacitor values and through varying an amount of delay to delay the input clock signal, a distribution of jitter may be designed. Furthermore, a host device may act to vary capacitance values of variable capacitors and to vary a delay caused by a variable delay block through changing an operational mode of the jitter generator and/or of the variable delay block. These techniques involving the on-die jitter generator improve memory device technology by enabling verification activities at a variety of stages during and after manufacturing.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
   an integrated circuit; and
   a jitter generator located on the integrated circuit, comprising:
      a random number generator configured to generate a random number in response to a clock input signal;
      delay-causing circuitry configured to receive the clock input signal, and wherein the delay-causing circuitry is configured to create a delayed clock input signal; and
      a phase mixer configured to receive the random number, the delayed clock input signal, and the clock input signal, and wherein the phase mixer is configured to output a clock output signal comprising the clock input signal and jitter.

2. The device of claim 1, wherein the jitter generator is configured to receive a first clocking signal or a second clocking signal as the clock input signal and is configured to output the clock output signal to a command decoder, a delay locked loop, or an input/output interface, or any combination thereof.

3. The device of claim 1, wherein the delay-causing circuitry is configured to have a variable delay value, wherein the variable delay value is configured to vary based at least in part on an operational mode of the jitter generator.

4. The device of claim 3, comprising a first variable capacitor and a second variable capacitor, wherein the first variable capacitor is configured to couple to the phase mixer, wherein the second variable capacitor is configured to couple to the delay-causing circuitry, and wherein the first variable capacitor and the second variable capacitor are configured to vary in a capacitance value based on the operational mode of the jitter generator.

5. The device of claim 3, comprising a first variable capacitor and a second variable capacitor, wherein the first variable capacitor is configured to couple to the phase mixer, wherein the second variable capacitor is configured to couple to the delay-causing circuitry, and wherein the first variable capacitor and the second variable capacitor are configured to vary in a capacitance value based on a control signal configured to transmit from the random number generator.

6. The device of claim 5, wherein the random number generator is configured to transmit one or more bits as the random number to the phase mixer, and wherein the control signal is configured to comprise a bit of the one or bits transmitted from the random number generator.

7. The device of claim 1, comprising a first capacitor and a second capacitor, wherein the first capacitor is configured to couple to the phase mixer, and wherein the second capacitor is configured to couple to the delay-causing circuitry.

8. The device of claim 1, wherein the delay-causing circuitry comprises combinational logic configured to delay the clock input signal an amount to create the delayed clock input signal.

9. The device of claim 1, wherein the random number generator comprises a linear feedback shift register comprising a plurality of flip-flops and XOR gates, wherein the linear feedback shift register is configured to count in a pseudo-random counting order, and wherein the random number generator is configured to output the random number based at least in part on the pseudo-random counting order.

10. A jitter generator, comprising:
    a first variable capacitor configured to change a first value of capacitance in response to a first control signal, wherein the first variable capacitor is configured to receive a clock-in signal;
    a second variable capacitor configured to change a second value of capacitance in response to the first control signal, wherein the second variable capacitor is configured to receive the clock-in signal;
    a delay-causing circuitry configured to couple to the second variable capacitor, wherein the delay-causing circuitry is configured to receive the clock-in signal from the second variable capacitor, and wherein the delay-causing circuitry is configured to generate a delayed clock-in signal by delaying the clock-in signal;
    a random number generator configured to receive the clock-in signal, and wherein the random number generator is configured to generate a random number in response to the clock-in signal; and
    a phase mixer configured to receive the random number from the random number generator, to receive the clock-in signal from the first variable capacitor, and to receive the delayed clock-in signal from the delay-causing circuitry, and wherein the phase mixer is configured to generate a clock-out signal comprising the clock-in signal and added jitter.

11. The jitter generator of claim 10, wherein the first variable capacitor and the second variable capacitor are each configured to have a third value of capacitance in response to a second control signal, and wherein the first variable capacitor and the second variable capacitor are each configured to have a fourth value of capacitance in response to a third control signal.

12. The jitter generator of claim 11, wherein the delay-causing circuitry is configured to cause a variable amount of delay based at least in part on operational modes of the jitter generator, wherein a first operational mode corresponds to the first control signal, a second operational mode corresponds to the second control signal, and a third operational mode corresponds to the third control signal.

13. The jitter generator of claim 10, wherein the random number generator comprises a linear feedback shift register having combinational logic configured to enable counting in a non-sequential order in response to the clock-in signal.

14. A method, comprising:
    receiving an input clock signal;
    receiving a mode selection signal indicative of an operational mode;

delaying the input clock signal through transmission in delay-causing circuitry, wherein a delay of the input clock signal caused by the delay-causing circuitry changes a value of the delay in response to the mode selection signal; and outputting, via a jitter generator, an output clock signal comprising the input clock signal and additional jitter, wherein the output clock signal is generated in response to a random number acting to mix phases of the input clock signal and a delayed input clock signal transmitted from the delay-causing circuitry.

15. The method of claim 14, wherein one or more variable capacitors change capacitance value in response to the mode selection signal.

16. The method of claim 15, wherein the delay-causing circuitry comprises one or more NAND logic gates and one or more inverting logical gates responsive to the mode selection signal.

17. A method comprising:
receiving an input clock signal;
generating the random number by providing the input clock signal to pseudo-random counting circuitry, wherein the random number is represented with a plurality of bits;
transmitting a subset of the plurality of bits to one or more capacitors configured to activate in response to the subset of the plurality of bits, wherein a capacitance value of the one or more capacitors is configured to change in response to activation;
delaying the input clock signal through transmission in delay-causing circuitry; and
outputting an output clock signal comprising the input clock signal and additional jitter, wherein the output clock signal is generated in response to a random number acting to mix phases of the input clock signal and a delayed input clock signal transmitted from the delay-causing circuitry.

18. The method of claim 14, comprising:
generating the random number by providing the input clock signal to a linear feedback shift register, wherein the linear feedback shift register is configured to count in a non-binary sequential order mimicking a pseudo-random counting order;
at a first rising edge of the input clock signal, providing the random number to a phase mixer through a parallel transmission of bits for a first binary number associated with the non-binary sequential order; and
at a second rising edge of the input clock signal, providing the random number to the phase mixer through the parallel transmission of bits for a second binary number associated with the non-binary sequential order.

19. The method of claim 14, wherein the output clock signal comprises the additional jitter causing a Gaussian distribution of one or more amounts of jitter.

20. The method of claim 14, wherein the input clock signal is an internal clock signal CLK, a phase controlled internal locked clock signal LCLK, or any combination thereof.

* * * * *